United States Patent
Li et al.

(10) Patent No.: US 8,965,596 B2
(45) Date of Patent: Feb. 24, 2015

(54) SOLAR ARRAY WITH ELECTRICAL TRANSMISSION LINE COMMUNICATION

(75) Inventors: Szu-Han Li, Taoyuan County (TW); Chih-Chieh Hsieh, Tainan (TW); Tong Hong Fu, Taichung (TW)

(73) Assignee: TSMC Solar Ltd., Taichung (TW)

( * ) Notice: Subject to any disclaimer, the term of this patent is extended or adjusted under 35 U.S.C. 154(b) by 446 days.

(21) Appl. No.: 13/410,835

(22) Filed: Mar. 2, 2012

(65) Prior Publication Data
US 2013/0231797 A1 Sep. 5, 2013

(51) Int. Cl.
*G06F 19/00* (2011.01)
(52) U.S. Cl.
USPC ............................ 700/297; 700/292; 700/298
(58) Field of Classification Search
CPC ..................... H01L 31/02021; H01L 31/0428; Y02B 10/14; Y02B 10/50
USPC ......................................... 700/297, 292, 298
See application file for complete search history.

(56) References Cited

U.S. PATENT DOCUMENTS

| | | | | |
|---|---|---|---|---|
| 7,456,588 | B2 * | 11/2008 | Alexandrov | 315/294 |
| 8,013,474 | B2 * | 9/2011 | Besser et al. | 307/99 |
| 8,040,235 | B2 * | 10/2011 | Koga et al. | 340/538 |
| 8,138,910 | B2 * | 3/2012 | Iwai | 340/538 |
| 2008/0077336 | A1 * | 3/2008 | Fernandes | 702/57 |
| 2008/0121272 | A1 * | 5/2008 | Besser et al. | 136/248 |
| 2008/0238195 | A1 * | 10/2008 | Shaver et al. | 307/18 |
| 2009/0102618 | A1 * | 4/2009 | Iwai | 340/310.11 |
| 2012/0019074 | A1 * | 1/2012 | Frolov et al. | 307/82 |
| 2012/0068543 | A1 * | 3/2012 | Caraglio et al. | 307/71 |
| 2012/0152300 | A1 * | 6/2012 | Zuckerman et al. | 136/244 |

FOREIGN PATENT DOCUMENTS

| | | |
|---|---|---|
| CN | 101227090 A | 7/2008 |
| CN | 101714763 A | 5/2010 |

OTHER PUBLICATIONS

"A primer on power line communication", Cypress Semiconductor, EE Times-India, 2011.*
Official Action issued Sep. 9, 2014, in counterpart Taiwan Patent Application No. 10321248440.

* cited by examiner

*Primary Examiner* — Michael D Masinick
(74) *Attorney, Agent, or Firm* — Duane Morris LLP

(57) ABSTRACT

A solar string includes first and second solar modules coupled to first and second filters by an electric transmission line. The second solar module includes a solar panel including a plurality of photovoltaic cells configured to convert photon energy to electrical energy. A processor is coupled to the solar panel and is in communication with the first solar module. The processor is configured to monitor an output of the solar panel and to transmit a status signal including an environmental condition of the second solar module to the first solar module by way of the electric transmission line. The first and second filters are configured to pass electrical power to a central inverter of a solar array in which the solar string is disposed and to prevent the status signal transmitted from the second solar module to the first solar module from being transmitted to the central inverter.

20 Claims, 3 Drawing Sheets

SOLAR ARRAY WITH ELECTRICAL TRANSMISSION LINE COMMUNICATION

FIELD OF DISCLOSURE

The disclosed systems and methods relate to solar arrays. More specifically, the disclosed systems and methods relate to reducing power reduction of solar arrays when partially shaded.

BACKGROUND

Renewable energy sources are becoming increasingly more prevalent as people try to reduce their dependence on non-renewable source such as oil. The sun's energy is one example of a renewable energy source that has been increasingly used to provide energy to homes and businesses through the use of solar arrays that convert the sun's energy to electricity. However, conventional solar arrays experience significant power reduction when the array is blocked by partial shade.

DETAILED DESCRIPTION

This description of the exemplary embodiments is intended to be read in connection with the accompanying drawings, which are to be considered part of the entire written description.

An improved solar array is disclosed that includes a number of low pass filters to advantageously reduce power reduction when the solar array is partially shaded. The improved solar array also enables the amount of cable wiring to be reduced while reinforcing the reliability of the solar array.

Figure 1:
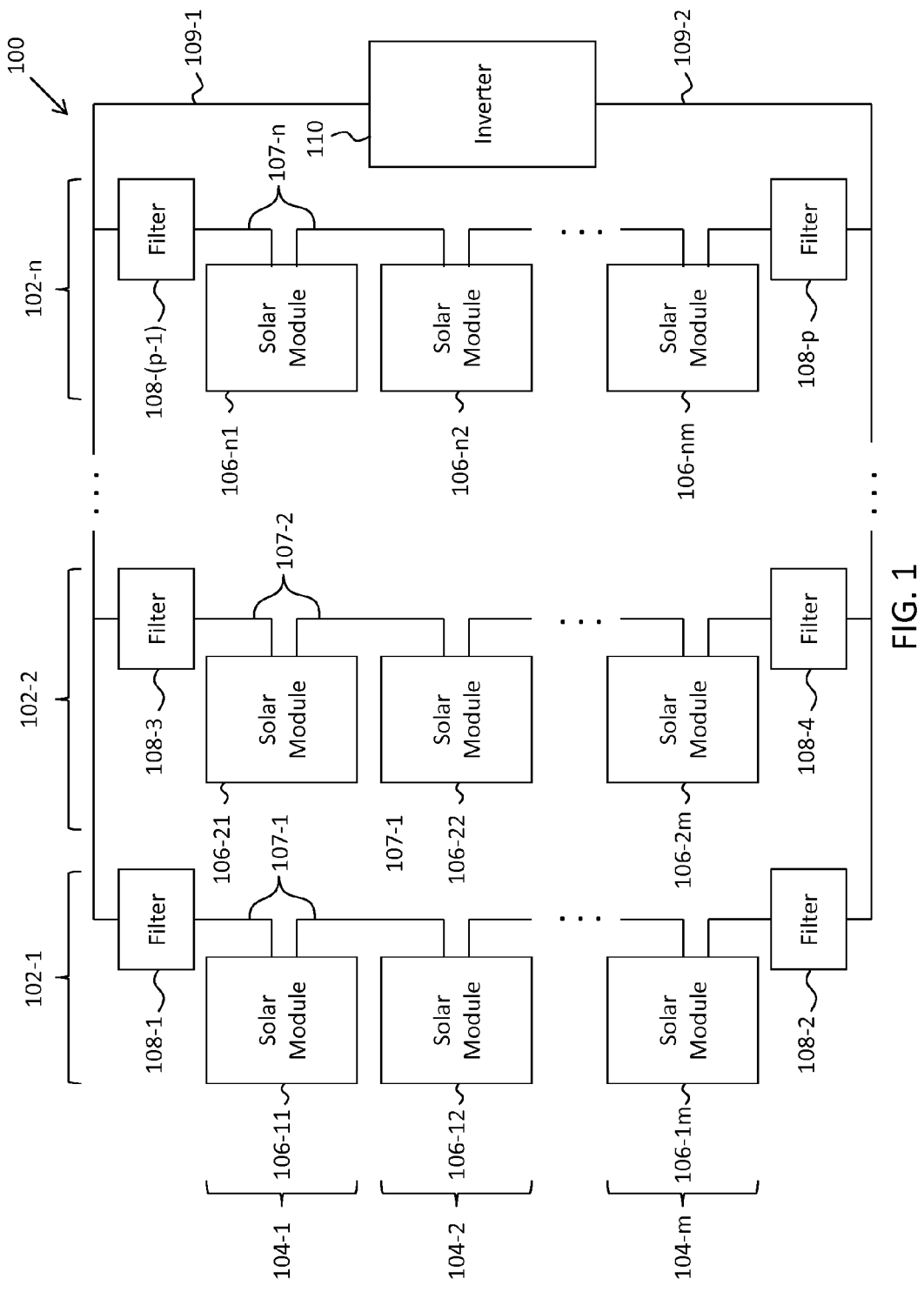
FIG. 1 illustrates one example of an improved solar array.

As illustrated in FIG. 1, the improved solar array 100 includes a number, n, of columns 102 and a number, m, of rows 104 of solar modules ("SM") 106. The solar modules 106 in a column 104, for example, are coupled to a respective pair of filters 108 by electric power transmission lines 107-1, 107-2, 107-n. For example, each of the solar modules 106 disposed in column 102-1 (e.g., solar modules 106-11, 106-12, 106-1m) are coupled to filters 108-1 and 108-2 by a single electric power transmission line 107-1, each of the solar modules 106 disposed in column 102-2 (e.g., solar modules 106-21, 106-22, 106-2m) are coupled to filters 108-3 and 108-4 by a single electric power transmission line 107-2, and each of the solar modules 106 disposed in column 102-n (e.g., solar modules 106-n1, 106-n2, 106-nm) are coupled to filters 108-(p−1) and 108-p by a single electric power transmission line 107-n.

Filters 108-1, 108-3, and 108-(p−1) are coupled to central inverter 110 by electric transmission line 109-1, and filters 108-2, 108-4, and 108-p are coupled to central inverter 110 by electric transmission line 109-2. Central inverter 110 is configured to provide convert an alternating current ("AC") output power signal in response to receiving direct current ("DC") power signals from filters 108 a power output for array 100 as will be understood by one skilled in the art. Although FIG. 1 illustrates each filter 108 being coupled to a respective column 102 of solar modules 106, one skilled in the art will understand that array 100 may be configured such that each pair of filters 108 is coupled to a respective row 104 of solar modules 106.

Figure 2:
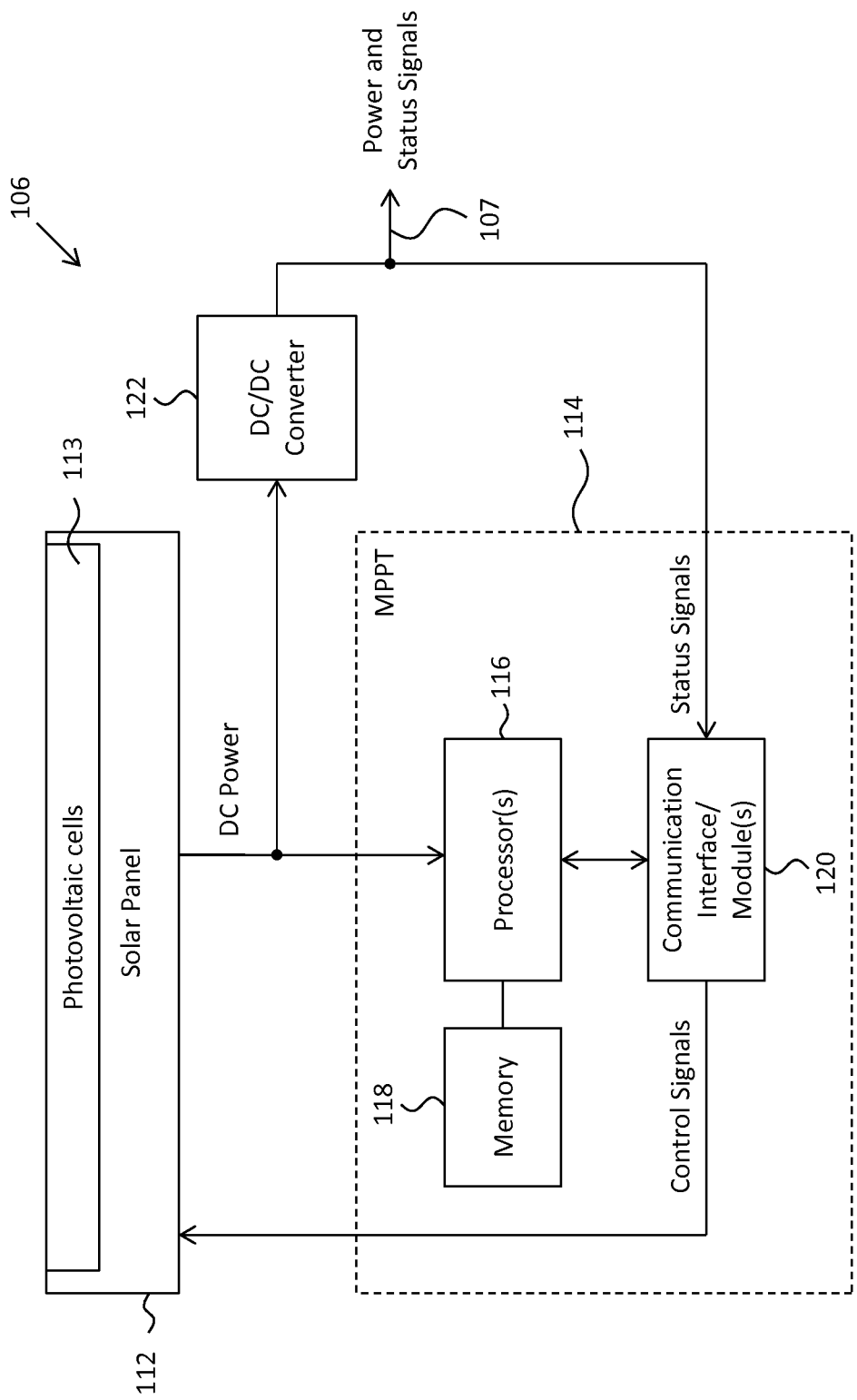
FIG. 2 is a block diagram of one example of a solar module in accordance with the improved solar array illustrated in FIG. 1.

FIG. 2 illustrates one example of a solar module 106 in accordance with the solar array 100 illustrated in FIG. 1. As shown in FIG. 2, solar module 106 may include a solar panel 112 comprising a plurality of photovoltaic cells 113 configured to generate electricity from light energy, i.e., photons, received from the sun or other photonic energy source. Such photovoltaic cells 113 may be fabricated from crystalline silicon and/or thin-film cells using cadmium telluride or silicon. Diodes (not shown) may be used to prevent reverse current as will be understood by one skilled in the art.

A Maximum Power Point Tracking ("MPPT") block 114 is coupled to solar panel 112 such that MPPT block 114 can monitor the power output from solar panel 112 and provide control signals to solar panel 112. In some embodiments, MPPT block may include one or more processor(s) 116 and a memory 118 in communication with processor(s) 116. Processor(s) 116 may be any central processing unit ("CPU"), microprocessor, micro-controller, or computational device or circuit for executing instructions.

Processor(s) 116 may be configured to monitor/sample the an output from solar panel 112 and adjust features of the panel 112 to optimize the output under current environmental conditions. As will be understood by one skilled in the art, processor(s) 116 may be configured to monitor the power, including voltage and/or current, output from solar panel 112 and apply a resistance to the output of the solar panel 112 to generate a current-voltage ("I-V") curve. Processor(s) may use the I-V curve to determine a maximum current that may be drawn from the solar panel 112 to maximize the power output of the respective panel 112.

Memory 118 may be a random access memory ("RAM"), such static RAM ("SRAM") or dynamic RAM ("DRAM"), or a read only memory ("ROM"). Examples of ROMs include, but are not limited to, programmable ROM ("PROM"), and erasable EPROM ("EPROM"), electrically erasable PROM ("EEPROM"). Memory 118 is configured to store data such that processor(s) 116 may generate the I-V curve and perform other functions as will be understood by one skilled in the art.

MPPT block 114 may also include one or more communication module(s) and/or interface(s) 120 for routing control signals from processor(s) 116 to solar panel 112 and transmitting and receiving status signals identifying environmental conditions from processor(s) to and from other solar modules 106 disposed in a same column 102 or row 104. The communication interface and protocol for transmitting control signals from processor(s) 116 to solar panel 112 may be different than the communication interface and protocol used to transmit and receive status signals to and from other solar modules 106 in the same column 102 or row 104. In some embodiments, for example, status signals are routed between solar modules 106 in a same string, such as a same column 102 or row 104 coupled to a common pair of filters 108, by way of the same physical power transmission line used to transmit power from the solar panels 112 to central inverter 110.

Solar module 106 also includes a DC to DC ("DC-DC") converter 122. DC-DC converter 122 may be a separate component or formed integrally with MPPT block 114 and/or solar panel 112. DC-DC converter 122 is configured to receive a first DC voltage output from a solar panel 112 and output a second DC voltage that is stabilized, i.e., is less transient, compared to the first DC voltage. In some embodiments, DC-DC converter 122 may include a transformer for transforming the first DC voltage level to a second DC voltage level.

Referring again to FIG. 1, filters 108 may be a low-pass filter ("LPF") configured to pass power signals, which oscillate at low frequencies, while blocking high-frequency signals. In some embodiments, the low frequencies signals are equal to lower than 100 Hz, and high frequencies are at or above 1 kHz. One of ordinary skill in the art will understand that the low frequencies and the high frequencies may be outside of these boundaries that are set forth as examples. Other filters, such as band-pass filters, may also be implemented as filters 108 as will be understood by one skilled in the art. When implemented as an LPF, filters 108 may include a resistor-capacitor ("RC") circuit having an RC time constant that produces a cutoff frequency above the nominal frequency at which the DC power signals oscillate. In particular, filters 108 may be designed to block the frequencies at which status and control signals are routed between solar modules in a string to prevent the status signals from being transmitted to inverter 110 or to other strings.

Figure 3:
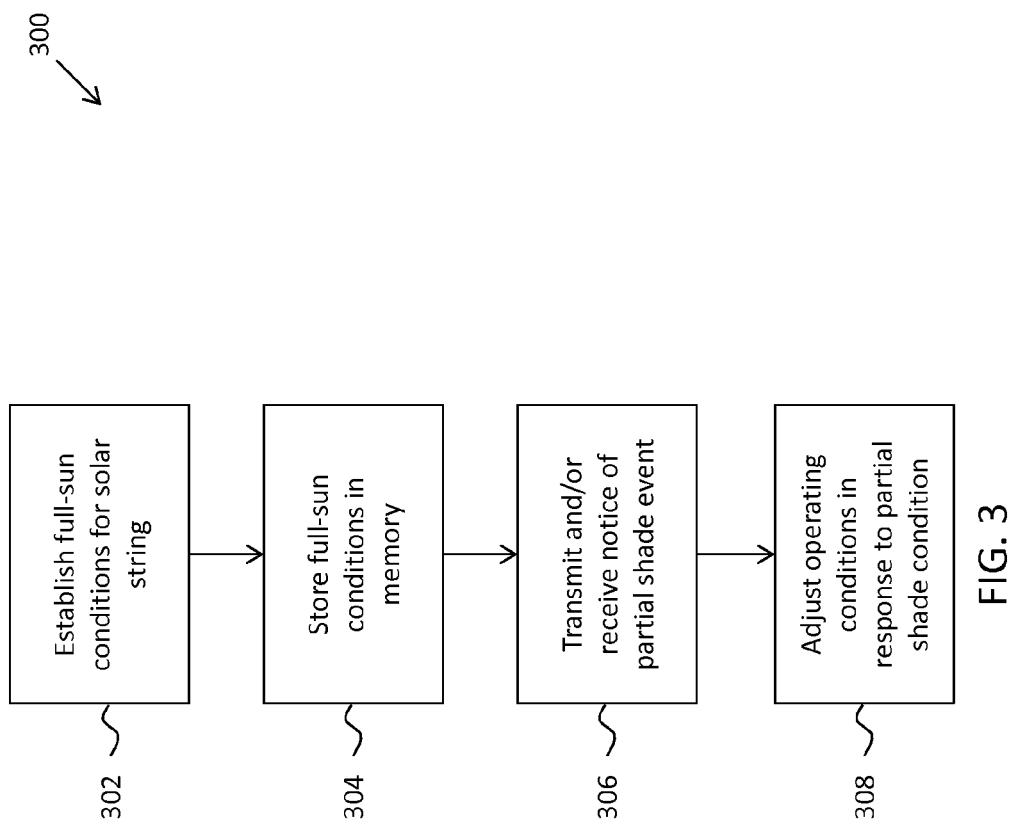
FIG. 3 is a flow diagram of one example of a method of reducing the effects of a partial shade event on a solar string.

A method for minimizing the effect from a solar array being partially shaded is described with reference to FIG. 3, which is a flow diagram of one example of such a method 300. The method 300 described below may be performed by one or more of the solar modules 106 in a particular solar string.

At block 302, the full-sun or normal operating conditions, e.g., power, voltage, and current, of a solar string (e.g., a column 102 or row 104 of solar modules 106 coupled to a common pair of filters 108) is established. For example, each of the solar modules 106 in column 102-1 may be configured to output a voltage of 100 V and a current of 1 A in an environmental condition in which the module 106 is fully exposed to the sun. The voltage output of the solar string, which in the illustrated in FIG. 1 corresponds to a column 102, may be calculated using the following equation:

$$V_{string} = N_n \times V_n + N_s \times V_s \qquad \text{Eq. 1}$$

Where,
$N_n$ is the number of non-shaded modules;
$V_n$ is the voltage output of the non-shaded solar modules;
$N_s$ is the number of shaded solar modules (i.e., number of full sun modules); and
$V_s$ is the voltage output of the shaded solar modules.

Assuming there are three solar modules 106 in each of the solar strings 102 illustrated in FIG. 1, i.e., m=3, and each solar module 106 outputs 50 V in a full-sun condition, then $V_{string}$ is equal to 150 V in a full sun condition, i.e., $N_s$=0. As will be understood by one skilled in the art, the power output of a string in a full-sun condition, $P_{string}$, is equal to the product of the string current, $I_{string}$, and the $V_{string}$. Accordingly, the power of the three solar module string described above is 150 W during a full-sun condition.

The operating conditions of a solar string in a first environmental condition, e.g., a full-sun condition, may be stored in a memory at block 304. In some embodiments, each of the solar modules 106 in a string of solar modules stores the full-sun operating conditions of the string in its respective memory 118 in response to receiving the full-sun operating conditions for the other solar modules 106 in the string via communication interface/module 120. In some embodiments, a single one of the solar modules 106, such as a solar module 106 disposed directly adjacent to one filter 108 of a pair of filters, in a string performs the calculations and stores the full-sun operating condition for the entire string in its respective memory 118.

At block 306, one or more of the solar modules 106 experiences a change in an environmental condition, such as becoming partially shaded or being exposed to direct sunlight if previously shaded, and one or more of the solar modules 106 in a string transmits and/or receives notice of such event. For example, when a solar module 106 in a string, such as solar module 106-12 in column 102-1, row 104-2, becomes at least partially shaded, the processor(s) 116 of shaded solar module 106-12 measures a drop in the voltage, current, and/or power output from solar panel 112. Upon identifying the voltage, current, and/or power drop, processor(s) 116 generate a status signal to be transmitted by communication interface(s)/module(s) 120 to the other solar modules 106 in the string.

The status signal may be transmitted from solar module 106-12 to the other solar modules 106 in the string over the electric transmission line that connects the solar modules 106 in the string to each other and to filters 108-1 and 108-2. The status signal transmitted by solar module 106-12 may include environmental condition data, such as voltage, current, and/or power, that is modulated in a carrier wave having a frequency that is outside of the pass band of filters 108-1 and 108-2 such that the status signals transmitted in one string, e.g., column 102-1, are not transmitted to another string, e.g., columns 102-2 and/or 102-n. The status signal transmitted by the shaded solar module 106-2 is received at each of the other solar modules 106 in the same string 102.

At block 308, one or more of the solar modules in the string in which the shaded solar module 106 is disposed adjusts its operating conditions in response to receiving notice of the shade event. In some embodiments, each of the solar modules 106 that receive the status signal from the shaded module 106-12 use Equation 1 to determine the appropriate operating parameters to adjust for shaded module 106-12. For example, if the status signal received from solar module 106-12 provides that shaded solar module 106-12 is outputting 7.14 V and 0.7 A, then the other solar modules 106 in the string will calculate that they need to increase their respective voltage output to 71.43 V (150 V=$2 \times V_n$+7.14 V) to compensate for the reduced voltage output of the shaded solar module 106-12 such that the output voltage of column 102 is 150V.

The processor(s) 116 of the solar modules 106 transmit control signals by way of the communication interface/module 120 to its respective solar panel 112 to adjust the performance characteristics of the panel 112. As will be understood by one skilled in the art, solar panel 112 may change its internal operations to adjust its performance in response to the control signals received from processor(s) 116.

In some embodiments, one of the solar modules 106 in a column 102 (or row 104 depending on the configuration of a string) may operate as a controller for the entire string. For example, solar module 106-11 may be configured to receive status signals from each of the other solar modules 106 disposed in the same string. Processor(s) 116 of solar module 106-11 determines the appropriate operating parameters (e.g., voltage, current, and/or power) for each of the solar modules 106 in the same string based on the status signals using Equation 1. The calculated operating parameters for each of the solar modules 106 in the same string may then be transmitted from the controlling solar module 106-11 to the other solar modules 106 in the same string by way of the communication interface/module 120 and the power lines used to connect the solar modules 106 of the same string.

Each of the other solar modules 106 in the same string receive the status and/or control signals from the controlling solar module 106-11 and their respective processor(s) 116 extract the data from the signals. The processor(s) 116 of the solar modules 106 then transmit control signals by way of the communication interface/module 120 to its respective solar panel 112 to adjust the performance characteristics of the panel 112. As will be understood by one skilled in the art, solar panel 112 may change its internal operations to adjust its performance in response to the control signals received from processor(s).

The communication between solar modules 106 in a common string may be done periodically. For example, each of the solar modules 106 may be configured to transmit its status to the other solar modules 106 in the same string at a predetermined time interval that differs from a time interval during which another solar module 106 transmits its status. One skilled in the art will understand that such periodic communication protocols may be implemented regardless of whether or not one of the solar modules 106 in a string is configured to operate as a controller for the string.

In embodiments in which one of the solar modules 106 in a string is configured as a controller, the periodic communication may be performed by a controlling solar module 106 polling the other solar modules 106 in the same string. For example, the solar module 106 acting as the controller may periodically transmit a status request signal to each of the solar modules in the same string. In response to the status request signal, each of the solar modules 106 may transmit its respective status to the solar module 106 acting as the controller.

The communications between solar modules 106 may also be event driven. For example, each of the solar modules 106 may transmit its respective status during an initialization or power-up operation and in response to other events, such as when one of the solar modules 106 becomes shaded or becomes exposed to direct sunlight. One skilled in the art will understand that various methods of communication between solar modules 106 in a common string may be implemented.

In some embodiments, a solar string includes first and second solar modules coupled to first and second filters by an electric transmission line. The second solar module includes a solar panel including a plurality of photovoltaic cells configured to convert photon energy to electrical energy. A processor is coupled to the solar panel and is in communication with the first solar module. The processor is configured to monitor an output of the solar panel and to transmit a status signal to the first solar module by way of the electric transmission line. The status signal includes an environmental condition of the second solar module. The first and second filters are configured to pass electrical power to a central inverter of a solar array in which the solar string is disposed and to prevent the status signal transmitted from the second solar module to the first solar module from being transmitted to the central inverter.

In some embodiments, a method includes monitoring an output of a solar panel coupled to an electric transmission line, identifying a change in the output of the solar panel, and transmitting a first signal identifying an environmental condition to a solar module coupled to the electric transmission line in response to identifying the change in output of the solar panel. The first signal is transmitted at a frequency that differs than a frequency of the output of the solar panel such that a filter coupled to the electric transmission line is configured to block the first signal from being passed to a central inverter coupled to the filter.

In some embodiments, a solar array includes a central inverter and a plurality of solar strings coupled to the central inverter. At least one of the plurality of solar strings includes a first solar module coupled to first and second filters by an electric transmission line. A second solar module is coupled to the first and second filters and to the first solar module by the electric transmission line. The second solar module includes a solar panel including a plurality of photovoltaic cells configured to convert photon energy to electrical energy and a processor coupled to the solar panel and in communication with the first solar module by way of the electric transmission line. The processor is configured to monitor an output of the solar panel and transmit a status signal to the first solar module by way of the electric transmission line. The status signal includes an environmental condition of the second solar module. The first and second filters are configured to pass electrical power to the central inverter and to prevent the status signal transmitted from the second solar module to the first solar module from being transmitted to the central inverter.

The improved solar strings and array described above advantageously enable solar modules in a particular solar string to communicate with each other while preventing cross-talk between solar strings. The communication between solar modules in a common solar string enables the solar modules to adjust their outputs to compensate for changes in environmental conditions experienced by one or more of the solar modules in a string. The ability to compensate for changes in environmental conditions experienced by different modules in a string reduces the effect of shade or partial shade on the performance of a string. Additionally, the disclosed architecture may be implemented with minimal wiring thereby reducing the cost of a solar array.

The present invention can be embodied in the form of methods and apparatus for practicing those methods. The present invention can also be embodied in the form of program code embodied in tangible media, such as floppy diskettes, CD-ROMs, DVD-ROMs, Blu-ray disks, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A solar string, comprising:
   first and second filters;
   a first solar module coupled to and disposed between the first and second filters by an electric transmission line; and
   a second solar module coupled to and disposed between the first and second filters, the second solar module including
      a solar panel including a plurality of photovoltaic cells configured to convert photon energy to electrical energy, and a processor coupled to the solar panel and in communication with the first solar module by way of the electric transmission line, the processor configured to monitor an output of the solar panel and to transmit a status signal to the first solar module by way of the electric transmission line, the status signal including an environmental condition of the second solar module, wherein the first and second filters are configured to pass electrical power to a central inverter of a solar array in which the solar string is disposed and to prevent the status signal transmitted from the second solar module to the first solar module from being transmitted to the central inverter.

2. The solar string of claim 1, wherein the environmental condition identifies if the second solar module is shaded.

3. The solar string of claim 1, wherein the processor is configured to output control signals to the solar panel for adjusting an output of the solar panel in response to a change in the environmental condition of the second solar module.

4. The solar string of claim 3, wherein the output of the solar panel includes a voltage level.

5. The solar string of claim 1, wherein the second solar module is configured to receive a status signal transmitted by the first solar module identifying an environment condition of the first solar module.

6. The solar string of claim 5, wherein the processor is configured to output control signals to the solar panel for adjusting an output of the solar panel in response to the status signal received from the first solar module.

7. The solar string of claim 6, wherein the output of the solar panel includes a voltage level.

8. The solar string of claim 1, further comprising a plurality of solar modules coupled to the first and second filters and to the first and second solar modules by the electric transmission line, each of the plurality of solar modules configured to transmit status signals identifying an environmental condition to each of the other solar modules and to receive status signals identifying an environmental condition from each of the other solar modules.

9. A method, comprising:
monitoring, at a first solar module disposed between a first filter and a second filter, an output of a solar panel of the first solar module that is coupled to an electric transmission line;
identifying a change in the output of the solar panel; and
transmitting a first signal identifying an environmental condition to a second solar module in response to identifying the change in output of the solar panel, the second solar module being disposed between the first filter and the second filter and being coupled to the electric transmission line,
wherein the first signal is transmitted at a frequency that differs than a frequency of the output of the solar panel such that the first filter and the second filter coupled to the electric transmission line are configured to block the first signal from being passed to a central inverter coupled to the first filter and the second filter.

10. The method of claim 9, further comprising:
receiving a second signal from a solar module identifying a change in an environmental condition of the solar module; and
transmitting a control signal to the solar panel to adjust the output of the solar panel in response to the second signal.

11. The method of claim 10, wherein adjusting the output of the solar panel includes increasing a power output of the solar panel.

12. The method of claim 10, wherein adjusting the output of the solar panel includes decreasing a power output of the solar panel.

13. The method of claim 9, wherein the change in the output of the solar panel includes a decrease in at least one of a voltage or a current.

14. The method of claim 9, wherein the change in the output of the solar panel includes an increase in at least one of a voltage or a current.

15. A solar array, comprising:
a central inverter; and
a plurality of solar strings coupled to the central inverter, at least one of the plurality of solar strings including:
a first solar module coupled to and disposed between first and second filters by an electric transmission line, and
a second solar module coupled to and disposed between the first and second filters, the second solar module including
a solar panel including a plurality of photovoltaic cells configured to convert photon energy to electrical energy, and
a processor coupled to the solar panel and in communication with the first solar module by way of the electric transmission line, the processor configured to monitor an output of the solar panel and transmit a status signal to the first solar module by way of the electric transmission line, the status signal including an environmental condition of the second solar module,
wherein the first and second filters are configured to pass electrical power to the central inverter and to prevent the status signal transmitted from the second solar module to the first solar module from being transmitted to the central inverter.

16. The solar array of claim 15, wherein the processor is configured to output control signals to the solar panel for adjusting an output of the solar panel in response to a change in the environmental condition of the second solar module.

17. The solar array of claim 15, wherein the second solar module is configured to receive a status signal transmitted by the first solar module identifying an environment condition of the first solar module.

18. The solar array of claim 17, wherein the processor is configured to output control signals to the solar panel for adjusting an output of the solar panel in response to the status signal received from the first solar module.

19. The solar array of claim 15, wherein the at least one of the solar strings includes a plurality of solar modules coupled to the first and second filters and to the first and second solar modules by the electric transmission line, each of the plurality of solar modules configured to transmit status signals identifying an environmental condition to each of the other solar modules and to receive status signals identifying an environmental condition from each of the other solar modules.

20. The solar array of claim 15, wherein each of the solar strings includes
a pair of filters, and
a plurality of solar modules coupled to the pair of filters, each of the plurality of solar modules configured to transmit status signals identifying an environmental condition to each of the other solar modules and to receive status signals identifying an environmental condition from each of the other solar modules,
wherein the pair of filters in each of the solar strings is configured to pass electrical power to the central inverter and to prevent status signals transmitted between the plurality of solar modules from being transmitted to the central inverter.

* * * * *